United States Patent [19]
Nishiura

[11] Patent Number: 6,139,633
[45] Date of Patent: Oct. 31, 2000

[54] SINGLE CRYSTAL PULLING APPARATUS

[75] Inventor: Kiyofumi Nishiura, Nara, Japan

[73] Assignee: Sumitomo Metal Industries, Ltd., Osaka, Japan

[21] Appl. No.: 09/254,087

[22] PCT Filed: Aug. 29, 1997

[86] PCT No.: PCT/JP97/03042

§ 371 Date: Mar. 1, 1999

§ 102(e) Date: Mar. 1, 1999

[87] PCT Pub. No.: WO98/10125

PCT Pub. Date: Mar. 12, 1998

[30] Foreign Application Priority Data

Sep. 3, 1996 [JP] Japan .................................. 8-232910
Sep. 6, 1996 [JP] Japan .................................. 8-236361
Sep. 6, 1996 [JP] Japan .................................. 8-236654

[51] Int. Cl.[7] .................................................. C30B 15/30
[52] U.S. Cl. ........................... 117/208; 117/218; 117/911
[58] Field of Search .................................. 117/208, 218, 117/911

[56] References Cited

U.S. PATENT DOCUMENTS

| 5,126,113 | 6/1992 | Yamagishi et al. | 422/249 |
| 5,330,729 | 7/1994 | Oda et al. | 117/217 |
| 5,885,347 | 3/1999 | Tomioka et al. | 117/218 |
| 5,911,821 | 6/1999 | Iino et al. | 117/13 |
| 5,951,759 | 9/1999 | Inagaki et al. | 117/218 |
| 5,964,941 | 10/1999 | Iino et al. | 117/13 |

FOREIGN PATENT DOCUMENTS

| 62-15050 | 1/1987 | Japan . |
| 3-285893 | 12/1991 | Japan . |
| 3-295893 | 12/1991 | Japan . |
| 5-270974 | 10/1993 | Japan . |
| 5-270975 | 10/1993 | Japan . |
| 5-301793 | 11/1993 | Japan . |
| 3005910 | 10/1994 | Japan . |
| 7-172981 | 7/1995 | Japan . |
| 9-202691 | 8/1997 | Japan . |
| 9-249489 | 9/1997 | Japan . |

*Primary Examiner*—Benjamin L. Utech
*Assistant Examiner*—Matthew Anderson
*Attorney, Agent, or Firm*—Armstrong, Westerman, Hattori, McLeland & Naughton

[57] ABSTRACT

Apparatus for pulling a single crystal of this invention is suitable as a silicon single crystal pulling technology that meets the needs for increased efficiency in the manufacture of semiconductors and can thus be utilized in the field of manufacturing semiconductors. The apparatus includes pulling means for forming an engaging stepped portion on a single crystal and a holding mechanism for gripping the engaging stepped portion of the single crystal. As the weight of the single crystal increases as the single crystal pulling operation proceeds, the apparatus causes the holding mechanism to start holding the single crystal before the weight of the single crystal reaches the limit of a load that can be borne by the dash neck portion. As a result of such construction, even when pulling a single crystal that is heavy, the apparatus can engage and grip such single crystal reliably, thereby implementing safe production of single crystals free from falling accidents.

13 Claims, 9 Drawing Sheets

Fig. 2
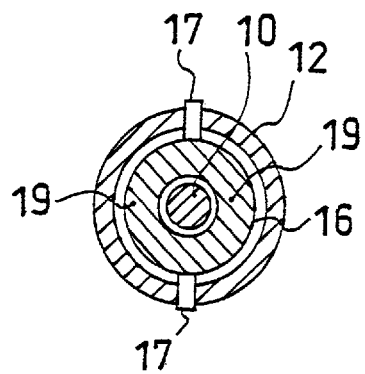
Fig. 3A
Fig. 3B
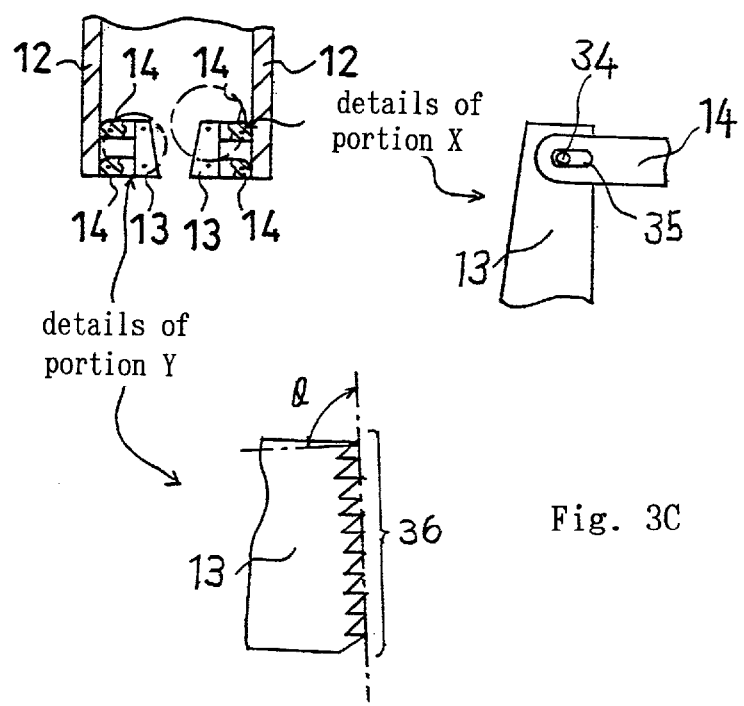
Fig. 3C (reference drawing)

SINGLE CRYSTAL PULLING APPARATUS

TECHNICAL FIELD

This invention relates to a pulling apparatus for producing a single crystal by a Czochralski method (hereinafter referred to simply as "CZ method"), and more particularly, to an apparatus for pulling a single crystal which, for the production of a heavy single crystal, can pull up the heavy single crystal safely without falling of the crystal.

BACKGROUND ART

There are many methods for producing a single crystal. Among them is a CZ method that relates to the growth of a silicon single crystal and that is widely used with its industrially mass-producible system. According to this method, a single crystal is produced first by bringing a seed crystal into contact with the surface of a melt of a crystal material contained in a crucible and then by rotating the crucible and pulling the seed crystal upward while rotating the crystal in a direction opposite to the direction of rotation of the crucible, so that the single crystal grows with the melt solidified at the lower end of the seed crystal.

In producing a single crystal using the CZ method, it is required to completely eliminate dislocations caused by thermal shock at the time the seed crystal is brought into contact with the melt and to thereby rid the dislocations of the body of the single crystal. Usually, a so-called "dash neck process" is adopted as a measure to meet the above requirement. In this process, the diameter of a single crystal is constricted to a small value in order to remove dislocations from the crystal surface to obtain a single crystal free from dislocations. The diameter of a dash neck required for the removal of dislocations is about 3 mm, and its length 30 mm.

The weight of a single crystal produced by the CZ method has heretofore been limited to about 20 to 30 kg. However, there is a strong demand for increased efficiency in the manufacture of semiconductors in recent years, and this has led to a tendency toward the increased diameter and length of a single crystal. As a result, single crystals as heavy as 100 kg or more are often produced. The weight of a single crystal is borne by the slender reduced dash neck portion. However, as the weight of a single crystal to be produced increases as described above, a limit is imposed on the bearing capacity of the dash neck portion. If a single crystal is so heavy that it receives a torsional force or a bending stress during the pulling operation, its dash neck portion is broken and the single crystal falls into the melt in the crucible. In addition, not only inconvenience including the damaging of the pulling apparatus, the overflowing of the melt and the vapor explosions occurs, but also there may be accidents resulting in injury or death.

For the purpose of preventing accidents including the falling of single crystals during the pulling operation which are likely to occur frequently as single crystals become increasingly heavier, improved pulling apparatuses have been proposed (see, e.g., JP3-285893, A and JP3-295893, A). That is, the falling of a single crystal during the course of the pulling is prevented by adopting a structure in which an engaging stepped portion is formed on an upper portion of the single crystal and in which the engaging stepped portion is engaged and gripped by a plurality of catches or a plurality of gripping holders each having a catch. Thus, when the proposed pulling apparatuses having such structure are used, a single crystal, even if it is heavy, can be pulled up reliably as well as safely, according to the disclosure.

The pulling apparatuses, disclosed in JP3-285893, A and JP3-295893, A cause the catches or the gripping holders having catches to engage and grip the engaging stepped portion formed on a single crystal as described above, and with this type of apparatus, it is important, in terms of quality, to eliminate displacement of the center of a single crystal from the pulling axis during the pulling operation. Thus, the aforementioned pulling apparatuses comprise a plurality of catches or a plurality of gripping holders, so that the displacement can be eliminated by finely adjusting the individual catches or gripping holders, and thus the engaging and gripping of the single crystal at the engaging stepped portion is made reliable.

However, since a single crystal is pulled up in a closed vacuum chamber, it is extremely difficult to finely adjust the catches or the gripping holders from outside through a remote operation, in such a manner that the catches or the gripping holders can coincide with the engaging stepped portion of the single crystal that is continuously elevating and rotating at all times. As a result, the adjusting of their positions at which to engage and grip the engaging stepped portion is susceptible to error, and once a displacement occurs, not only a significant impairment in the quality of a pulled single crystal results, but also the single crystal is so greatly inclined by receiving a torsional force during the pulling that the catches or the gripping holders may disengage and thus fall the single crystal.

DISCLOSURE OF INVENTION

The object of this invention is to overcome the aforementioned problems, addressed by the conventional pulling apparatuses, and therefore to provide an apparatus for pulling a single crystal capable of producing the single crystal efficiently and safely, without causing a falling accident of the single crystal, even if the single crystal is heavy by making reliable the engaging and gripping of the single crystal at an engaging stepped portion provided on the single crystal. The gist of the apparatus of pulling a single crystal of the invention completed from such viewpoints covers the following three pulling apparatuses, the first, the second and the third pulling apparatuses.

1. First Pulling Apparatus

As shown in FIGS. 1 and 6 to be referred to later, one aspect of the invention provides an apparatus for pulling a single crystal having main pulling means 21 of a wire type for forming an inverted-conical engaging stepped portion 6 on the single crystal to be pulled while rotated, a holding mechanism 11 for gripping the engaging stepped portion of the single crystal through engaging members, and sub pulling means 22 of a wire type for moving the holding mechanism up and down, characterized in that the sub pulling means moves the holding mechanism up and down through means 16 for preventing inclination of the holding mechanism, and elevates the holding mechanism in synchronism with a pulling speed of the main pulling means.

It is desirable in the aforementioned pulling apparatus that a drive motor of either one of the main pulling means 21 and the sub pulling means 22 be operated under a speed control system and that the other drive motor be operated under a tension control system. By adopting such control systems, the apparatus can pull up a single crystal while adjusting the pulling speed of the single crystal and the distribution of loads between the main pulling means and the sub pulling means.

As the engaging members of the holding mechanism, those having a self-clamping function are used, the self-clamping function serving to cancel nonuniformity in the circumferential shape of the engaging stepped portion through operation of link levers 14 or clamp levers 15. As a result, even if the engaging stepped portion is nonuniform shape, the engaging members can hold the engaging stepped portion through surface contact, and thus it is desirable in that falling accidents of single crystals can be avoided.

"Engaging members having a self-clamping function" herein means engaging members that adequately engage and grip the engaging portion while easily opening when pushed upward and closing when pushed downward by the operation of the link levers 14 or the clamp levers 15 as shown in FIG. 1, 3 or 6 to be referred to later (the engaging members being, e.g., clamp catches 13, link levers 14, pins 34 and elongated holes 35, or clamp levers 15).

Further, the aforementioned pulling apparatus may have a structure in which the main pulling means 21 and the sub pulling means 22 can move up and down independently of each other by the turning operation of ball screws, in place of wires, respectively (see FIG. 8 to be referred to later). By adopting such construction, displacement of the pulling axis can be eliminated, and thus the means for preventing inclination of the holding mechanism which is constructed of an equalizer or the like can be dispensed with.

2. Second Pulling Apparatus

As shown in FIG. 9 to be referred to later, another aspect of the invention provides an apparatus for pulling a single crystal having main pulling means 21 for forming an inverted-conical engaging stepped portion 6 on the single crystal to be pulled while rotated, a holding mechanism 11 for gripping the single crystal, and sub pulling means 22 for moving the holding mechanism up and down in synchronism with a pulling speed of the main pulling means, characterized in that the holding mechanism comprises push rods 44 for reciprocating up and down between predetermined positions to which the holding mechanism moves up and down, and engaging members 41 for engaging and gripping the engaging stepped portion 6 of the single crystal while turned by upwardly moving operation of the push rods.

"Engaging members" provided on the holding mechanism herein means engaging members each of which is formed integrally of a holding lever 42 and a rotating lever 43 as shown in FIGS. 9 and 11 to be referred to later. The distal end portion of the rotating lever 43 out of the components constituting the engaging member is in contact with the push rod 44.

In the second pulling apparatus, the main pulling means 21 and the sub pulling means 22 can move up and down independently of each other by winding and unwinding wires, respectively, and further the sub pulling means 22 can move the holding mechanism 11 up and down through means 16 for preventing inclination of the holding mechanism. As a result of such construction, the apparatus can eliminate inclination of the holding mechanism 11, thereby implementing stable pulling operation and improving the quality of a single crystal.

Further, the second pulling apparatus may have a structure in which the main pulling means 21 and the sub pulling means 22 can move up and down independently of each other by the turning operation of ball screws, respectively. In this case, displacement of the pulling axis can be eliminated, and thus the means for preventing inclination of the holding mechanism can be dispensed with.

3. Third Pulling Apparatus

As shown in FIG. 12 to be referred to later, still another aspect of the invention provides an apparatus for pulling a single crystal, having pulling means 52 for forming an inverted-conical engaging stepped portion 6 by pulling, while rotating the single crystal that is supported by a seed crystal holder 10, a holding mechanism 11 for gripping the engaging stepped portion 6 of the single crystal through engaging members 15, and a metal chamber 53 for accommodating the pulling means and the holding mechanism, characterized in that the seed crystal holder 10 has such a structure as to expand as the single crystal grows, and the holding mechanism 11 has such a structure as to be pulled while rotated in synchronism with the seed crystal holder after having gripped the engaging stepped portion of the single crystal with the engaging members.

In the third pulling apparatus, the seed crystal holder 10 may have a structure in which an upper holder can slide along a lower holder and in which an elastic spring is incorporated. Further, it is desirable that the holding mechanism be so structured as to float magnetically by providing a magnet 55 on a downwardly facing outer circumferential surface of the holding mechanism 11 and by providing a magnet 55 also on an upwardly facing inner circumferential surface of the metal chamber confronting the magnet on the downwardly facing outer circumferential surface.

BRIEF DESCRIPTION OF DRAWINGS

FIG. 2 is a transverse sectional view of a holding mechanism and an equalizer, taken along a line A—A of FIG. 1 and FIG. 9 that will be referred to later.

FIGS. 3A, 3B, 3C are diagrams illustrating a structure of an engaging member provided on the holding mechanism of the first pulling apparatus shown in FIG. 1, wherein FIG. 3A is a diagram illustrating a general construction, and FIG. 3B and FIG. 3C are diagrams illustrating detailed portions.

FIGS. 13A and 13B are longitudinal sectional views illustrating an exemplary structure of a seed crystal holder, wherein FIG. 13A is a diagram showing a case where the weight of a single crystal is equal to or smaller than a reference value, and FIG. 13B is a diagram showing a case where the seed crystal holder is expanded with the weight of a single crystal equal to or greater than the reference value.

BEST MODE FOR CARRYING OUT THE INVENTION

An apparatus for pulling a single crystal of this invention will now be described specifically in terms of the following first, second and third pulling apparatuses.

1. First Pulling Apparatus

The first pulling apparatus of this invention subjects a seed crystal to a dash neck process by causing main pulling means to first bring the seed crystal into the surface of a melt, and thereafter pull the crystal while rotating the crystal, and then forms an inverted-conical engaging stepped portion on a single crystal, and thereafter forms a shoulder and finally pulls up the body of the single crystal. On the other hand, while the weight of the single crystal increases as the pulling operation proceeds, sub pulling means starts its operation of holding the single crystal before the weight of the single crystal reaches the limit of a load that can be borne by the dash neck portion.

A specific operation of the apparatus is as follows. When a holding mechanism that is standing by in an upper position is lowered by the lowering operation of the sub pulling means, engaging members provided on the holding mechanism allow a large-diameter portion of the inverted-conical engaging stepped portion of the single crystal to pass therethrough with the engaging members opened while pushed upward by the engaging stepped portion. When the engaging members are loaded with the weight of the single crystal after having passed the large-diameter portion of the engaging stepped portion therethrough, the engaging members perform a self-clamping function by the operation of link levers or clamp levers. At that time, inclination preventing means for the holding mechanism such as an equalizer makes reliable the gripping of the single crystal at the engaging stepped portion, and also eliminates displacement of the single crystal that is being pulled.

When the holding mechanism completes its operation of engaging and gripping the single crystal, the holding mechanism is elevated with a pulling speed of the main pulling means synchronized with that of the sub pulling means. Further, the pulling speed and load distribution of the single crystal can be controlled by operating a drive motor of the main pulling means under a speed control system and a drive motor of the sub pulling means under a tension control system.

Specific exemplary constructions (Embodiments 1 to 3) of the first pulling apparatus will be described below on the basis of the drawings.

1-1. Embodiment 1

Figure 1:
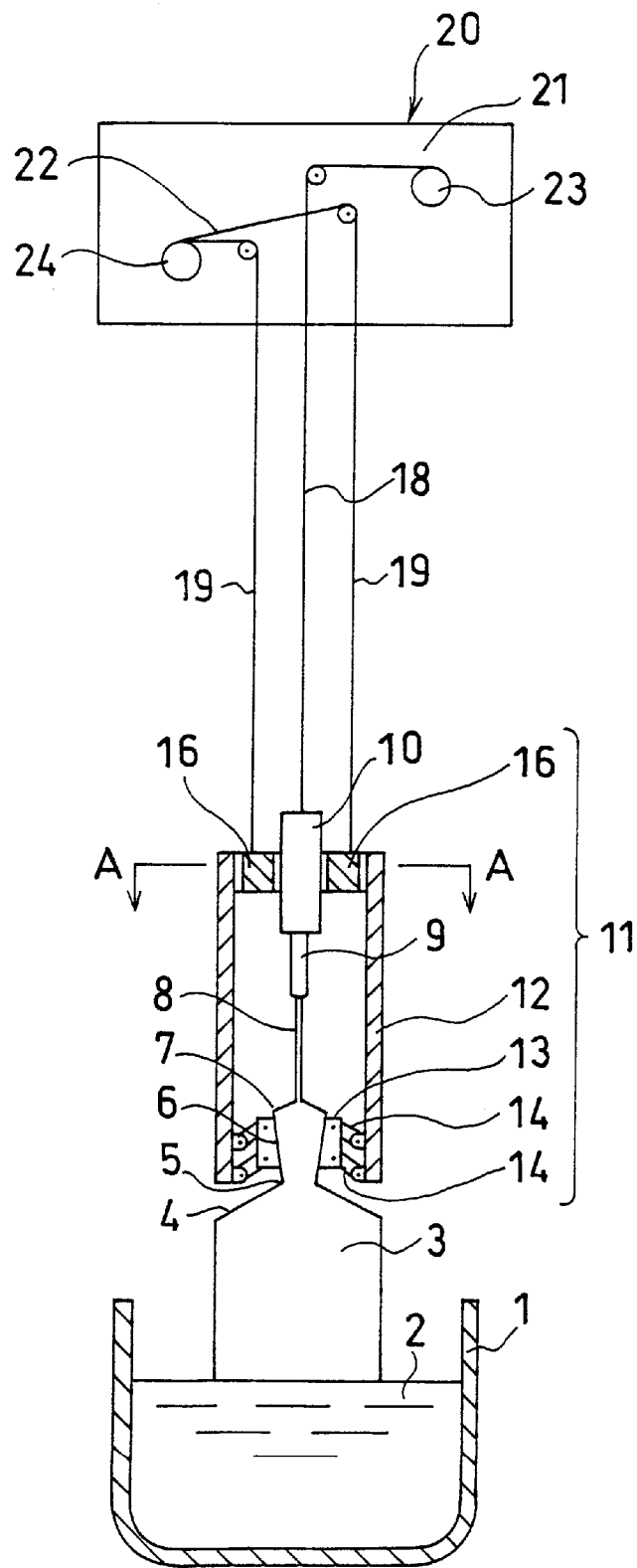
FIG. 1 is a longitudinal sectional view illustrating an exemplary general construction of a first pulling apparatus.

FIG. 1 is a longitudinal sectional view illustrating a general construction of Embodiment 1 of the first pulling apparatus of the invention. As shown in FIG. 1, a crucible 1 is provided at the center of a vacuum chamber (not shown), and the crucible 1 contains therein a melt 2, in which polysilicon serving as a raw material has melted. Above the crucible 1 are a seed crystal holder 10 and a holding mechanism 11. Further above the holder 10 and the mechanism 11 are main pulling means 21 and sub pulling means 22. The means 21 pulls up a silicon single crystal 3 by rotating the crystal, and the means 22 moves the holding mechanism 11 up and down. The means 21 and 22 constitute a pulling mechanism 20.

In Embodiment 1, a single main wire 18 to be wound by the main pulling means 21 and two sub wires 19 to be wound by the sub pulling means 22 are suspended, so that they are moved up and down independently of each other. Further, the pulling mechanism 20 comprising the main pulling means 21 and the sub pulling means 22 is rotated in a predetermined direction by a not-shown structure in order to rotate a single crystal at a constant speed during the pulling operation.

The seed crystal holder 10 is attached to the lower end of the main wire 18, while the holding mechanism 11 is arranged on the distal ends of the two sub wires 19 through an equalizer 16. The equalizer 16 used in this embodiment functions as the inclination preventing means for the holding mechanism 11.

FIG. 2 is a transverse sectional view of the holding mechanism and the equalizer, taken along a line A—A of FIG. 1 referred to above. The structure of the holding mechanism of the first pulling apparatus is such that, as shown in FIG. 2, the equalizer 16 is supported by a holder 12 through pins 17 and suspended by the two sub wires 19. Since the holding mechanism has such structure, the equalizer 16 does incline when the two sub wires 19 are wound up or paid off out of phase with each other. However, such inclination of the equalizer 16 is absorbed since the holder 12 that supports the equalizer 16 through the pins 17 is always held in the vertical direction by the gravitational attraction.

FIGS. 3A, 3B and 3C show a diagram illustrating a structure of each engaging member provided on the holding mechanism in Embodiment 1, wherein FIG. 3A shows a general construction, and FIG. 3B and FIG. 3C show details at portions X and Y in the general construction. As is apparent from FIGS. 3A, 3B and 3C, the engaging member is arranged at the lower end of the inner surface of the holder 12, and comprises a single clamp catch 13 and two upper and lower link levers 14 for the clamp catch 13. The link levers 14 may be attached to the holder 12 and the clamp catch 13 to the link levers 14 in any way as long as the levers 14 and the catch 13 are rotationally supported.

As shown in the details of portion X in FIG. 3B, an elongated hole 35 whose diameter is larger than a pin 34 is arranged in at least one of the connecting portions of the two upper and lower link levers 14. With such arrangement, even if the engaging stepped portion is nonuniform shape, the engaging surfaces of the clamp catches can be so adjusted to a single condition as to accommodate any shape of the engaging stepped portion, and therefore, even if a single crystal is heavy, the engaging members can grip such single crystal reliably. Further, as shown in the details of portion Y in FIG. 3C, if many saw-toothed or undulating projections are formed on the engaging surface of each clamp catch, the engaging members can grip a single crystal more reliably. It should be noted that the clamp catch is desirably made of a high melting point metal, such as molybdenum, which exhibits strong resistance against high temperatures and which is a noncontaminant. It should further be noted that the angle of contact $\theta$ between the undulating projection and the engaging stepped portion shown in FIG. 3C is desirably set to 90 degrees or more.

By adopting the structure shown in FIG. 3A to 3C for each engaging member, when the weight of a single crystal is loaded onto the clamp catches 13 and the link levers 14, the engaging members perform the self-clamping function through the operation of the link levers as described above, and thus can grip the engaging stepped portion of the single crystal adequately. Further, the number of engaging members to be provided on the inner circumference of the holder 12 must be plural, and three or more engaging members have to be arranged in order to prevent positional displacement.

Next, a specific operating procedure will be described. At the time of a single crystal pulling start, the sub pulling means 22 stands by with the holding mechanism 11 held in an upper position. On the other hand, a seed crystal 9 is attached to the seed crystal holder 10, provided on the distal end of the main pulling means 21, and the seed crystal 9 is brought into contact with the surface of the silicon melt 2 at a central part of the melt. The main pulling means 21 is thereafter operated to slowly elevate the seed crystal 9 by rotating the crystal, thereby forming a dash neck (seed constricted portion) 8. Then, the speed for pulling up the single crystal is decreased to increase the diameter of the single crystal, thereby forming a large-diameter portion 7. Thereafter, the diameter of the single crystal is gradually decreased so as to be as small as a constricted portion 5, thereby forming an engaging stepped portion 6 whose cross section is of an inverted cone.

After the engaging stepped portion 6 has been formed, the diameter of the single crystal is increased again, thereby forming a shoulder 4. Thereafter, the pulling and rotating speeds are adjusted to regular conditions, so that the operation proceeds to the next step of pulling up a single crystal body 3 having a predetermined diameter.

After the regular single crystal pulling operation has been started, when the weight of the single crystal being pulled reaches a predetermined value, for example, when the length of the single crystal body 3 is 1 m, the holding mechanism 11 that has been standing by in the upper position is lowered. During the lowering of the mechanism 11, the clamp catches 13 that are in contact with the large-diameter portion 7 of the single crystal are pushed upward to open, thereby letting the large-diameter portion 7 pass therethrough as described above. Thereafter, the clamp catches 13 engage and grip the engaging stepped portion 6 reliably by the self-clamping function based on the operation of the link levers, the pins and the elongated holes. Then, the sub pulling means 22 elevates the holding mechanism 11 in synchronism with the pulling speed of the main pulling means 21. It should be noted here that the timing at which the sub pulling means 22 elevates the holding mechanism 11 with the single crystal gripped by the clamp catches 13, which are the engaging members, may be after the weight of the single crystal has reached the predetermined value, i.e., at least in the latter half of the pulling operation.

Figure 4:
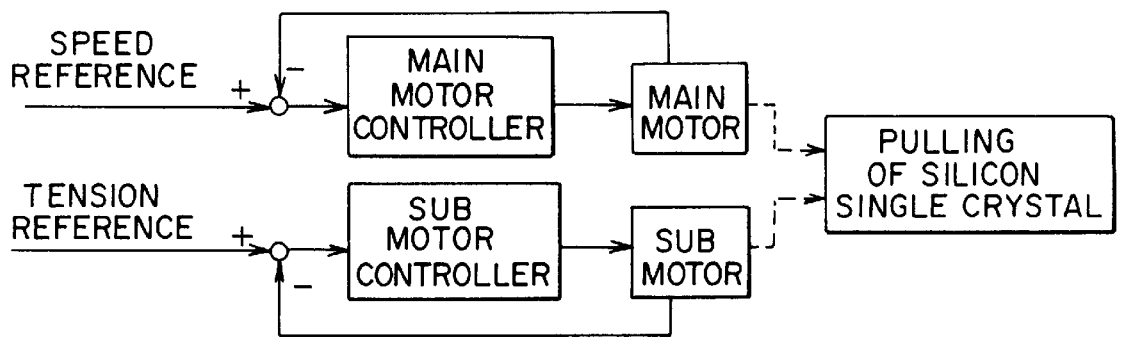
FIG. 4 is a diagram illustrating control systems of pulling motors in a pulling apparatus of this invention.

FIG. 4 is a diagram illustrating pulling motor control systems in a wire-type pulling apparatus of this invention. For the elevation of the holding mechanism 11 with the main pulling means 21 synchronized with the sub pulling means 22, it is desirable that a main motor 23 of the main pulling means 21 be operated based on speed control and that a sub motor 24 of the sub pulling means 22 based on tension control.

Figure 5:
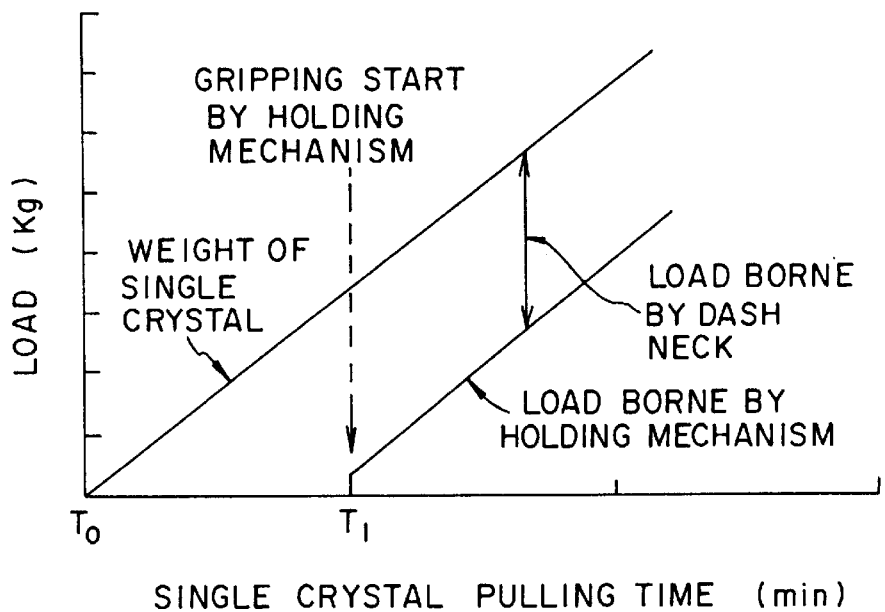
FIG. 5 is diagram showing a change in the load borne by the holding mechanism of the pulling apparatus.

By adopting such control systems for the pulling motors, the weight of a single crystal can be shared by the holding mechanism of the sub pulling means as shown in FIG. 5. Therefore, interference between the pulling motor control systems can be prevented, and the pulling speed and the load ratio between the main motor and the sub motor can be accurately controlled, and thus stable single crystal pulling operation free from shock can be implemented.

1-2. Embodiment 2

Figure 6:
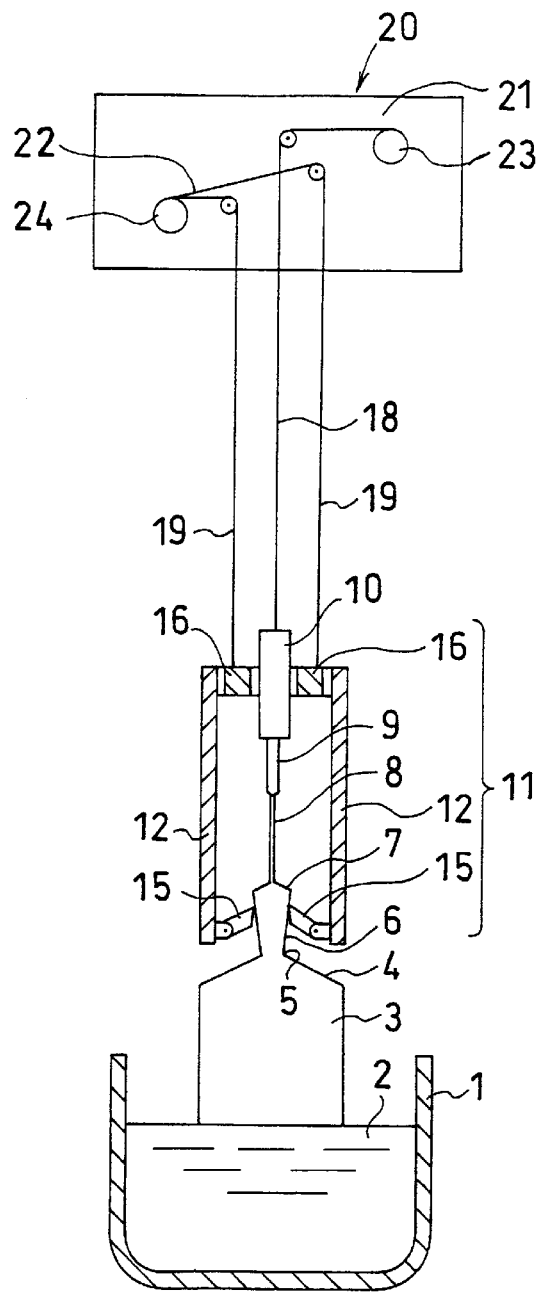
FIG. 6 is a longitudinal sectional view illustrating another exemplary construction of the first pulling apparatus.

FIG. 6 is a longitudinal sectional view illustrating an exemplary construction of Embodiment 2 of the first pulling apparatus. When compared with Embodiment 1 that has been described above, Embodiment 2 is distinguished in the construction of clamp levers 15 provided as the engaging members on the holding mechanism 11, but the other part of its construction is similar to that of Embodiment 1.

Figure 7:
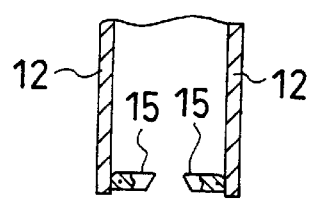
FIG. 7 is a diagram illustrating a structure of an engaging member provided on a holding mechanism of the pulling apparatus shown in FIG. 6 and FIG. 12 that will be referred to later.

FIG. 7 is a diagram illustrating a structure of each engaging member provided on the holding mechanism in Embodiment 2. The engaging members are provided on the lower end portion of the inner surface of the holder 12, and a plurality of clamp levers 15 are rotationally supported. As a result, the clamp levers 15 can turn substantially upright about the fulcrums provided on the side of the holder 12. However, once loaded downwardly, the clamp levers 15 can engage and grip the engaging stepped portion of a single crystal adequately with their self-clamping function. Thus, by using the engaging members of Embodiment 2, the clamp mechanism is made simple. In addition, since a single crystal is clamped with the end faces of the clamp levers, the length of the tapered portion of the engaging stepped portion of the single crystal can be made relatively short.

With respect to the function of the apparatus and its operating method, e.g., the pulling motor control systems shown in FIG. 4 referred to above, in the single crystal pulling operation, those of Embodiment 1 can be similarly applied to this embodiment.

1-3 Embodiment 3

Figure 8:
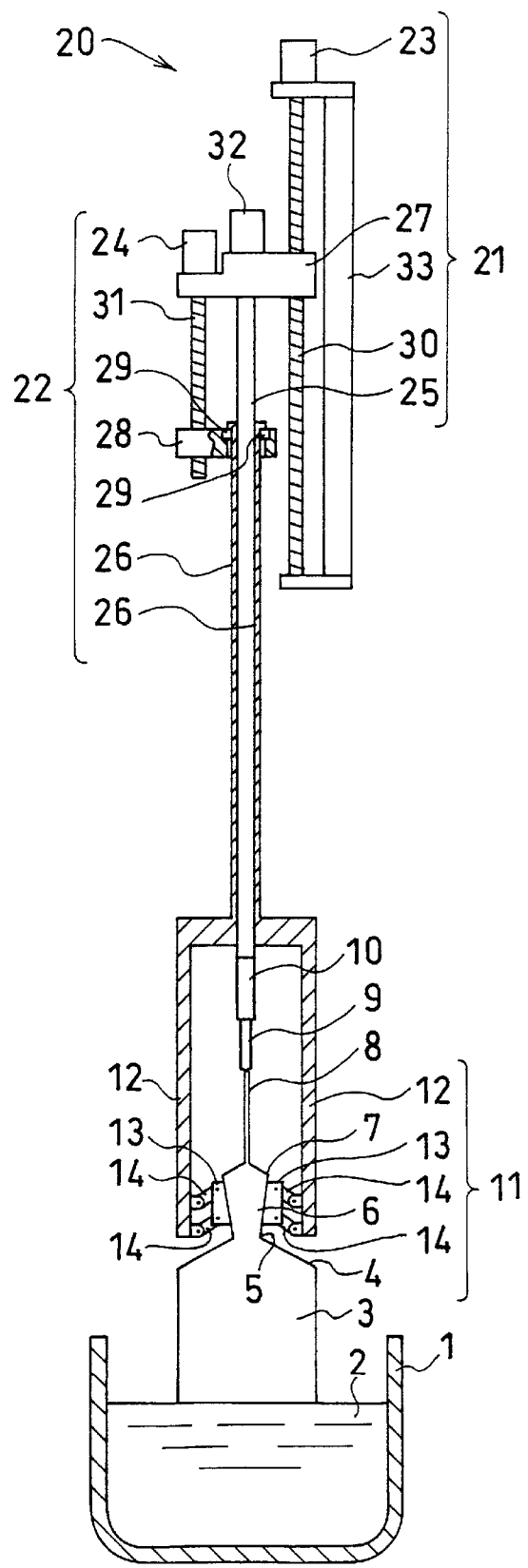
FIG. 8 is a diagram illustrating another exemplary general construction of the first pulling apparatus.

FIG. 8 is a diagram illustrating an exemplary construction of Embodiment 3 of the first pulling apparatus. The feature of this construction resides in the fact that the main pulling means 21 and the sub pulling means 22 can move up and down independently of each other by the turning operation of a main ball screw 30 and a sub ball screw 31.

In the construction of Embodiment 3, the main pulling means 21 and the sub pulling means 22 move a main elevating base 27 and a sub elevating base 28 up and down, respectively, as the pulling mechanism 20. The main elevating base 27 provided on the main pulling means 21 has the main ball screw 30 enclosed by a frame 33, and is moved up and down by the operation of the main motor 23. Further, the main elevating base 27 supports the seed crystal holder 10 through a shaft 25 at a lower portion of the shaft, and can rotate a single crystal to be pulled by the rotation of a crystal rotating motor 32 during the pulling operation.

On the other hand, the sub elevating base 28 provided on the sub pulling means 22 has the sub ball screw 31 that is mounted onto the main elevating base 27, and moves up and down by the rotating operation of the sub motor 24. Further, a hollow shaft 26 is also attached to the sub elevating base 28 so as to be rotational through a bearing 29, and the holding mechanism 11 is fixed to the distal end of the hollow shaft 26. The engaging members are arranged on the lower end portion of the inner surface of the holder 12 of the holding mechanism 11. Each engaging member may have any of the structures shown in Embodiments 1 and 2.

Embodiment 3 of the first pulling apparatus is constructed by causing the shaft 25 attached to the main elevating base 27 to pass through the inside of the hollow shaft 26 attached to the sub elevating base 28. As a result of such construction, the main pulling means 21 can be synchronized with the sub pulling means 22 easily, and in addition, the seed crystal holder 10 supported by the fitted shafts 25 and 26 can be well position-adjusted with respect to the holding mechanism 11, thereby allowing the center of a single crystal to coincide with the pulling axis.

2. Second Pulling Apparatus

A second pulling apparatus of this invention, similarly to the first pulling apparatus, performs the dash neck process with main pulling means, then forms an inverted-conical engaging stepped portion on a single crystal, and thereafter forms a shoulder and finally pulls up the body of the single crystal. On the other hand, while the weight of the single crystal increases as the pulling operation proceeds, sub pulling means starts its operation of holding the single crystal before the weight of the single crystal reaches the limit of a load that can be borne by the dash neck portion.

A specific operation of the apparatus is as follows. A holding mechanism that is standing by in an upper position is lowered by the lowering operation of the sub pulling means. For the lowering operation, push rods provided on the lower end of the holding mechanism elevate while pushed upward by the shoulder of a single crystal at a predetermined position. By such elevating operation, not only rotating levers of engaging members, which are in contact with the push rods, are pushed upward, but also holding levers turn, thereby engaging the engaging stepped portion of the single crystal. The receiving surfaces of the holding levers that have closed by turning form a ringlike shape with no cut line, and thus can engage and grip the single crystal reliably.

When the holding levers of the holding mechanism complete their operation of engaging and gripping the single crystal, the holding mechanism is elevated with a pulling speed of the main pulling means synchronized with that of the sub pulling means. At that time, it is desirable to provide inclination-preventing means such as an equalizer in order to eliminate inclination of the holding mechanism. A specific exemplary construction of the second pulling apparatus will be described below on the basis of the drawings.

Figure 9:
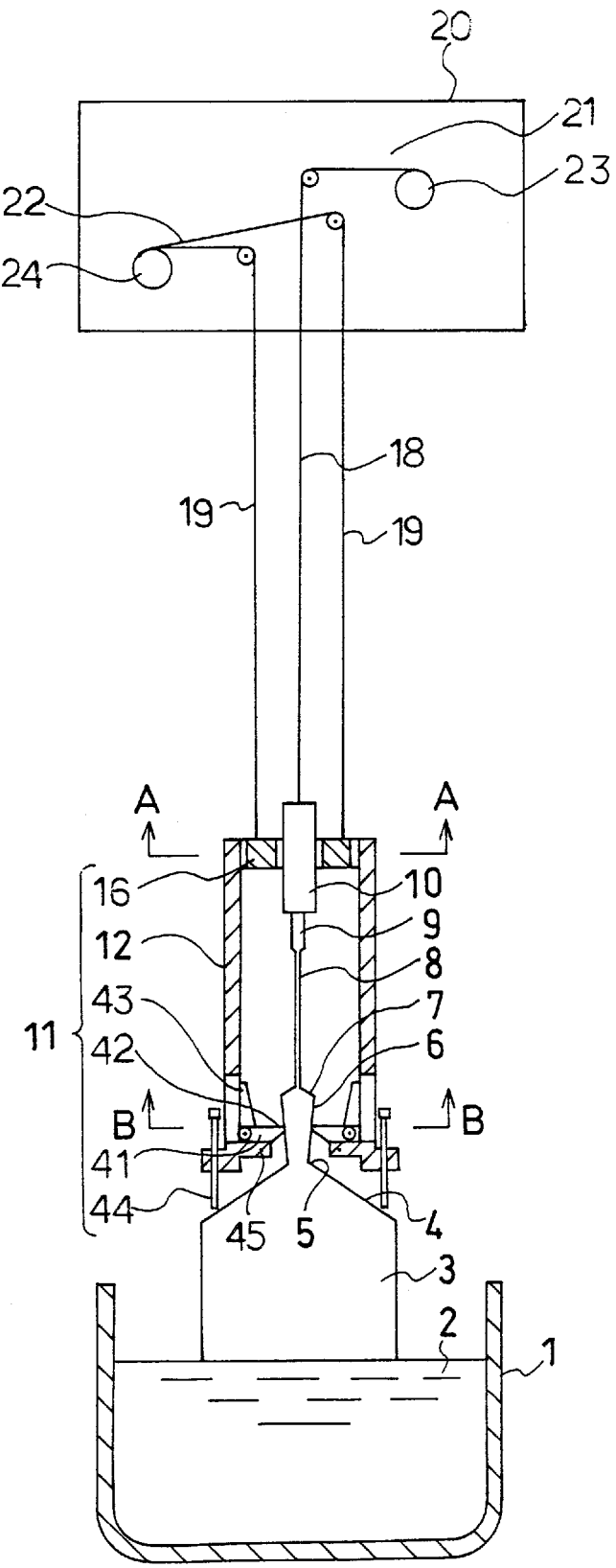
FIG. 9 is a longitudinal sectional view illustrating an exemplary general construction of a second pulling apparatus.

FIG. 9 is a longitudinal sectional view illustrating an exemplary general construction of the second pulling apparatus of this invention. As shown in FIG. 9, a crucible 1 is provided at the center of a vacuum chamber (not shown), and the crucible 1 contains therein a melt 2. Above the crucible 1 are a seed crystal holder 10 and a holding mechanism 11. Further above the holder 10 and the mechanism 11 are main pulling means 21 and sub pulling means 22. The means 21 pulls up a silicon single crystal 3 by rotating the crystal, and the means 22 moves the holding mechanism 11 up and down. The means 21 and 22 constitute a pulling mechanism 20.

In the second pulling apparatus, a single main wire 18 to be wound by the main pulling means 21 and two sub wires 19 to be wound by the sub pulling means 22 are suspended, so that they can be moved up and down independently of each other. Further, the pulling mechanism 20 comprising the main pulling means 21 and the sub pulling means 22 is rotated in a predetermined direction by a not-shown structure in order to rotate a single crystal at a constant speed during the pulling operation.

The seed crystal holder 10 is attached to the lower end of the main wire 18, while the holding mechanism 11 is arranged on the distal ends of the two sub wires 19 through an equalizer 16. The equalizer 16 used in this apparatus functions as the inclination-preventing means for the holding mechanism 11.

As shown in FIG. 2 referred to above, the equalizer 16 is supported by a holder 12 through pins 17 and suspended by the two sub wires 19. As a result, even if the two sub wires 19 are wound up out of phase with each other, it is only the equalizer 16 that inclines, leaving the holding mechanism 11 unaffected by the out-of-phase winding, similarly to the first pulling apparatus. Therefore, there is no likelihood that the central axis of the holding mechanism 11 gets out of the central axis of the single crystal 3, and thus the holding mechanism 11 can hold the single crystal reliably.

Figure 10:
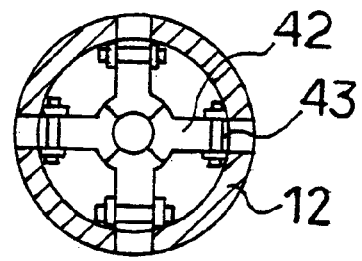
FIG. 10 is a plan view illustrating an exemplary construction of engaging members provided on a holding mechanism, taken along a line B—B of FIG. 9.

FIG. 10 is a plan view illustrating an exemplary construction of the engaging members provided on the holding mechanism, taken along a line B—B of FIG. 9 referred to above. As is apparent from FIGS. 9 and 11, an engaging member 41 is formed integrally of a holding lever 42 and a rotating lever 43. The engaging members 41 are rotationally attached to the lower end portion of the inner surface of the holder 12, and each holding lever 42 can turn 90 degrees about the fulcrum on the side of the holder 12 between an opened condition in which the lever 42 stands upright and a closed condition in which the lever 42 extends horizontal.

Figure 11:
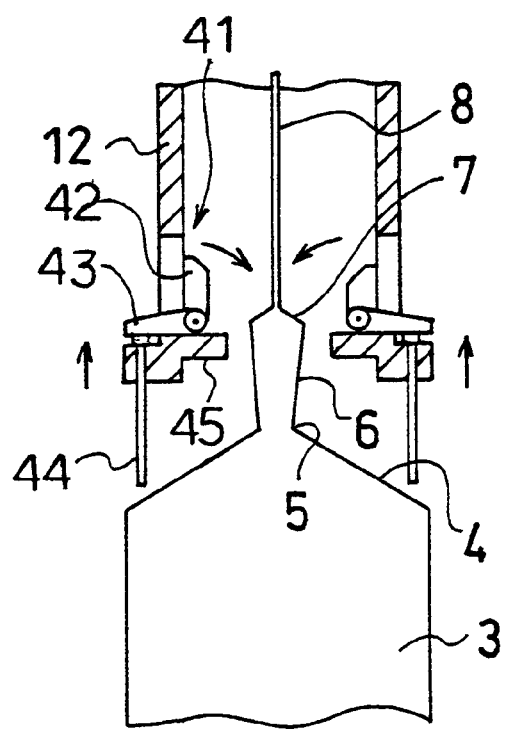
FIG. 11 is a diagram illustrating how the engaging members turn in association with the lowering of the holding mechanism in the second pulling apparatus.

FIG. 11 is a diagram illustrating how the engaging members turn in association with the lowering of the holding mechanism. As described above, the holding mechanism 11 that has been standing by in the upper position is lowered by the lowering operation of the sub pulling means before the weight of the single crystal reaches the limit of the load that can be borne by the main pulling means. For the lowering of the holding mechanism, the push rods 44 provided on the lower end of the holding mechanism 11 elevate while pushed upward by a shoulder 4 of the single crystal after a large-diameter portion 7 formed on the engaging stepped portion of the single crystal has moved past the lower end portion of the holding mechanism 11. As a result of the elevating operation of the push rods 44, the rotating levers 43 that are in contact with the push rods 44 are pushed upward, so that the holding levers 42 formed integrally with the rotating levers 43 turn to be closed in such a manner as to engage the engaging stepped portion of the single crystal. The closed holding levers 42 are supported by stoppers 45, and form a hole having a predetermined diameter as shown in FIG. 10 refereed to above. The diameter of the hole is smaller than that of the large-diameter portion of the single crystal, and in addition, the receiving surfaces of the holding levers form a ringlike shape with no cut line. Therefore, once the holding levers are closed, there is no likelihood that the holding levers disengage, and thus, even if there are dimensional errors in the engaging stepped portion of the single crystal, the holding levers can engage and grip the engaging stepped portion reliably.

In the second pulling apparatus in which each engaging member 41 comprises the holding lever 42 and the rotating lever 43, when the rotating levers 43 turn about 30 degrees from their horizontal condition as pushed upward by the push rods 44, the center of gravity of each engaging member 41 changes, after which the rotating levers 43 keep turning by their own weight, and the holding levers 42 get closed. The holding levers 42 as closed form a ringlike holding surface with their receiving surfaces getting together.

The number of engaging members to be provided on the inner circumference of the holder 12 is four in the example shown in FIG. 10, but it is not limited to this number as long as the selected number of engaging members can form a ringlike holding surface.

Next, a specific operating procedure will be described. At the time of a single crystal pulling start, the sub pulling means 22 stands by with the holding mechanism 11 held in an upper position. On the other hand, a seed crystal 9 is attached to the seed crystal holder 10 provided on the distal end of the main pulling means 21, and the seed crystal 9 is brought into contact with the surface of the silicon melt 2 at a central part of the melt. The main pulling means 21 is thereafter operated to slowly elevate the seed crystal 9 by rotating the crystal, thereby forming a dash neck (seed constricted portion) 8. Then, the speed for pulling up the single crystal is decreased to increase the diameter of the single crystal, thereby forming the large-diameter portion 7. Thereafter, the diameter of the single crystal is gradually decreased so as to be as small as a constricted portion 5, thereby forming an engaging stepped portion 6 whose cross section is of an inverted cone.

After the engaging stepped portion 6 has been formed, the diameter of the single crystal is increased again, thereby forming the shoulder 4. Thereafter, the pulling and rotating speeds are adjusted to regular conditions, so that the operation proceeds to the next step of pulling up a single crystal body 3 having a predetermined diameter.

After the regular single crystal pulling operation has been started, when the weight of the single crystal being pulled reaches a predetermined value, for example, when the length of the single crystal body 3 is 1 m, the holding mechanism 11 that has been standing by in the upper position is lowered. During the lowering of the mechanism 11, the holding levers 42 let the large-diameter portion 7 of the single crystal pass therethrough as they are opened as described with reference to FIG. 11 above, and are thereafter closed by the operation of the push rods that have been pushed upward by the shoulder 4 of the single crystal.

After the engaging members 41 of the holding mechanism 11 have engaged and gripped the engaging stepped portion 6, the sub pulling means 22 elevates the holding mechanism 11 in synchronism with the pulling speed of the main pulling means 21. It should be noted here that the timing at which the sub pulling means 22 elevates the holding mechanism 11 with the single crystal gripped by the holding levers 42, which are the engaging members, may be after the weight of the single crystal has reached the predetermined value, i.e., at least in the latter half of the pulling operation.

For the elevation of the holding mechanism 11 with the main pulling means 21 synchronized with the sub pulling means 22, it is desirable that a main motor 23 of the main pulling means 21 be operated based on speed control and that a sub motor 24 of the sub pulling means 22 based on tension control.

By adopting such pulling motor control systems, the weight of a single crystal can be shared by the holding mechanism of the sub pulling means. Therefore, interference between the pulling motor control systems can be prevented, and the pulling speed and the load ratio between the main motor and the sub motor can be accurately controlled, and thus stable single crystal pulling operation free from shock can be implemented.

While a system in which the main pulling means 21 and the sub pulling means 22 are moved up and down by winding and unwinding the wires has been described, the second pulling apparatus may also employ a system in which the means 21 and 22 are moved up and down by the turning operation of ball screws as shown in Embodiment 3 of the first pulling apparatus. In such a case, displacement of the pulling axis can be eliminated, and thus the inclination preventing means for the holding mechanism which is constructed of an equalizer or the like can be dispensed with.

3. Third Pulling Apparatus

A third pulling apparatus of this invention subjects a seed crystal to the dash neck process by causing pulling means to first bring the seed crystal into contact with the surface of a melt and thereafter pull the seed crystal while rotating the crystal, and then forms an inverted-conical engaging stepped portion on a single crystal, and thereafter forms a shoulder and finally pulls up the body of the single crystal. On the other hand, while the weight of the single crystal increases as the single crystal grows, a holding mechanism that is standing by in a metal chamber starts its operation of holding the single crystal before the weight of the single crystal reaches the limit of a load that can be borne by the dash neck portion.

A specific operation of the apparatus is as follows. At the time of a pulling start, the holding mechanism is caused to stand-by so as to be rotational at a predetermined height in the metal chamber. For example, it is desired that the holding mechanism stand-by while magnetically floated. Further, a clamp mechanism utilizing a clamp lever or a link lever is used as the engaging member of the holding mechanism.

The engaging stepped portion of a single crystal is elevated as the pulling means pulls up the single crystal, and comes in contact with the holding mechanism that has been standing by in an upper position. At that time, since the engaging members provided on the holding mechanism utilize clamp levers or the like, the engaging members are opened while pushed upward by the inverted-conical engaging stepped portion of the single crystal, thereby letting the large-diameter portion of the engaging stepped portion pass therethrough. After the large-diameter portion 7 of the engaging stepped portion has passed through, the engaging members of the holding mechanism are closed by their own weight so as to get along with the shape of the engaging stepped portion of the single crystal. Further, if the engaging members have the aforementioned structure, when the weight of the single crystal is loaded to the engaging members, the self-clamping function is performed by the operation of the link levers or the clamp levers. As a result, the self-clamping function makes reliable the gripping of the single crystal at the engaging stepped portion, leaving no problem even if the engaging stepped portion of a single crystal to be pulled is nonuniformly shaped or the pulling position is out of place.

A seed crystal holder has such a structure as to expand as a single crystal grows, and thus expands when the weight of a single crystal reaches a predetermined value as the single crystal pulling operation proceeds. As a result, the weight of the single crystal is loaded onto the engaging members, and the engaging members of the holding mechanism engage and grip the engaging stepped portion of the single crystal reliably. When the holding mechanism grips the engaging stepped portion of a single crystal with its engaging members in this way, the holding mechanism rotates at the same speed as the pulling means since the holding mechanism is rotationally supported by the metal chamber. In addition, as will be described later, the holding mechanism is designed to be pulled upward while supported by rims that are provided over the outer circumference of the seed crystal holder. Thus, after having engaged and gripped the engaging stepped portion, the holding mechanism is pulled upward while rotating in synchronism with the pulling means. A specific exemplary construction of the third pulling apparatus of this invention will be described below on the basis of the drawings.

Figure 12:
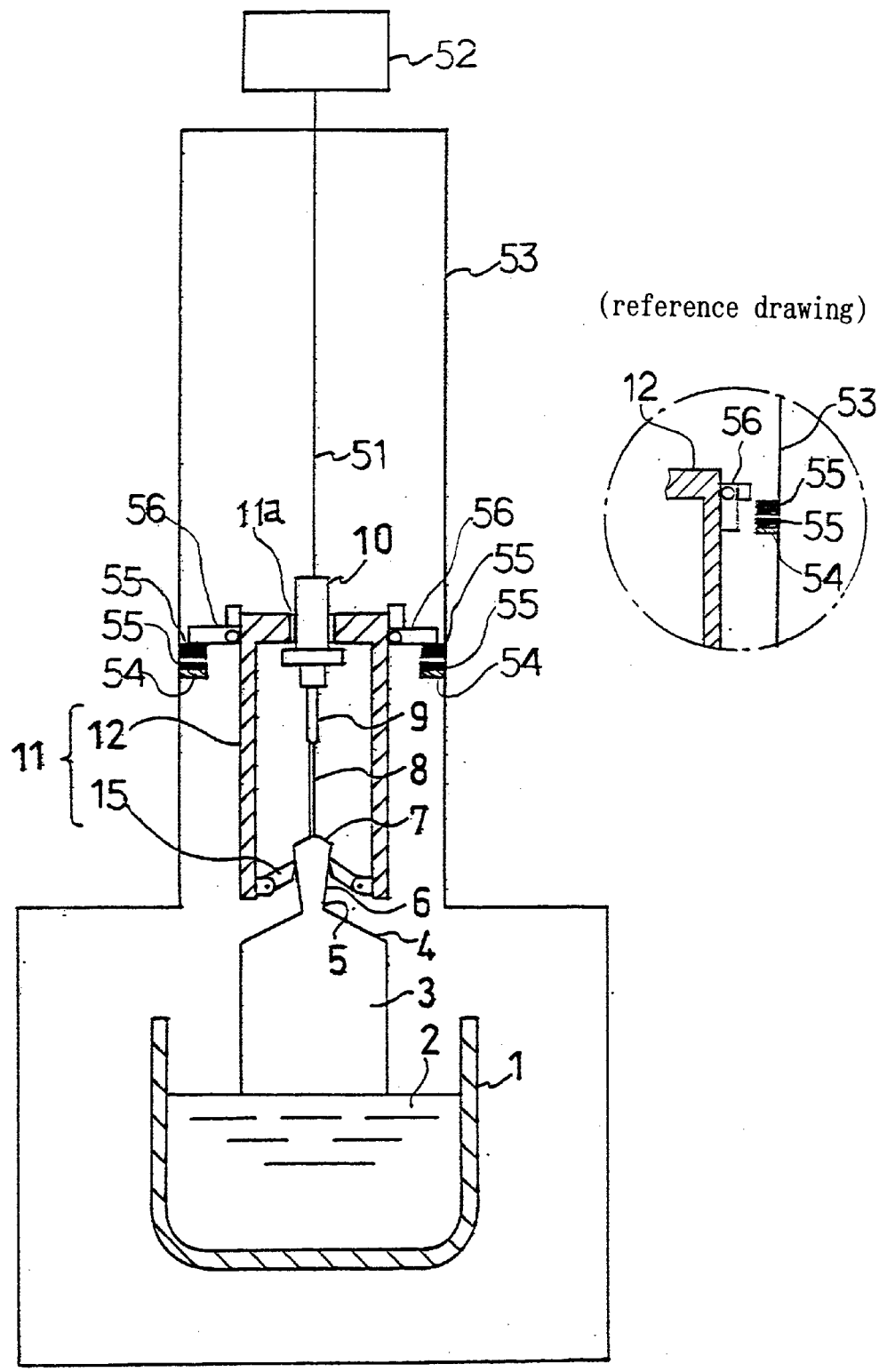
FIG. 12 is a longitudinal section view illustrating an exemplary general construction of a third pulling apparatus.

FIG. 12 is a longitudinal sectional view illustrating an exemplary general construction of the third pulling apparatus. As shown in FIG. 12, a crucible 1 is provided at the center of a metal chamber 53, and the crucible 1 contains therein a melt 2 in which polysilicon serving as a raw material has melted. Above the crucible 1 are a seed crystal holder 10 and a holding mechanism 11. Further above the holder 10 and the mechanism 11 is pulling means 52 that pulls up a silicon single crystal 3 by rotating the crystal.

A wire 51 is suspended from the pulling means 52, and the seed crystal holder 10 is attached to the lower end of the wire 51. Further, the pulling means 52 is rotated in a predetermined direction by a not-shown structure in order to rotate a single crystal at a constant speed during the pulling operation. As a result, the single crystal that is supported by the seed crystal holder 10 and pulled by the pulling means 52 elevates while rotating. Further, the seed crystal holder 10 is so structured as to expand as the single crystal grows.

Figures 13A, 13B:
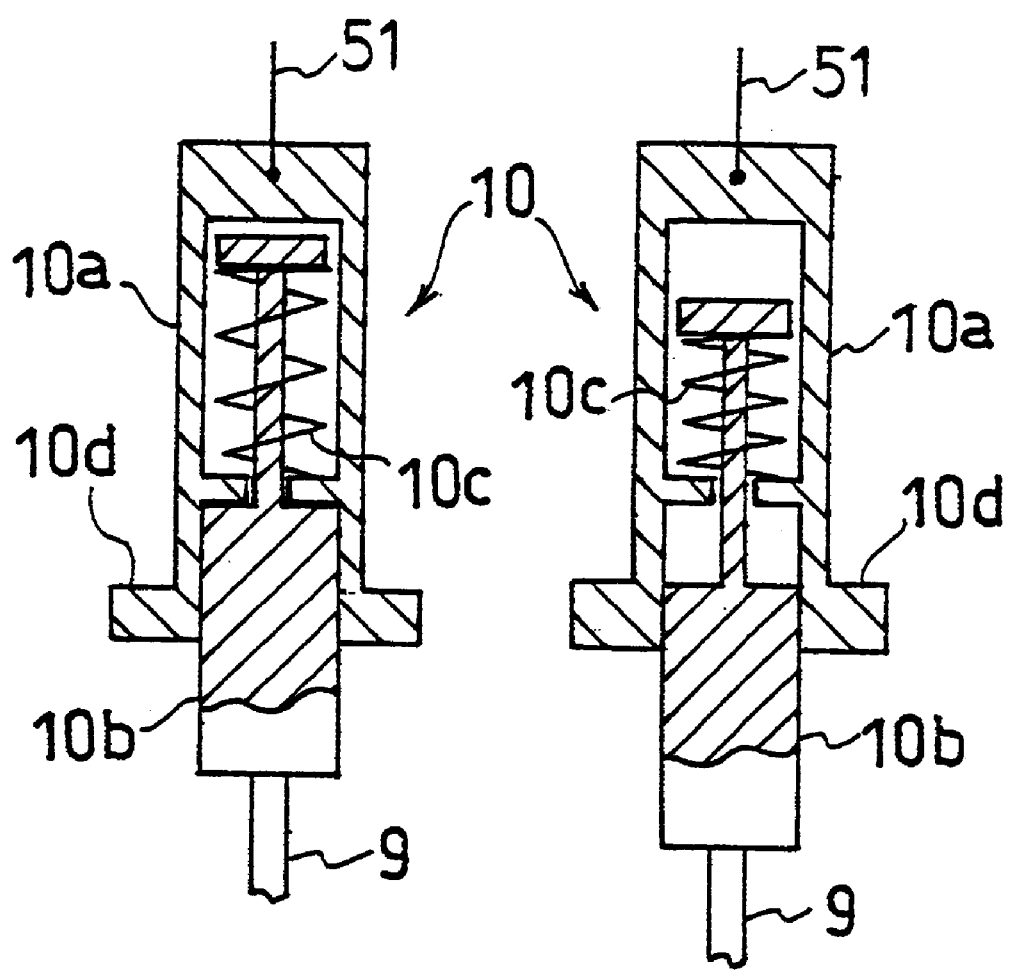

FIGS. 13A and 13B are longitudinal sectional views illustrating an exemplary structure of the seed crystal holder, wherein FIG. 13A shows a case where the weight of a single crystal is equal to or smaller than a reference value, and FIG. 13B shows a case where the seed crystal holder has expanded with the weight of a single crystal equal to or greater than the reference value. The seed crystal holder 10 attached to the distal end of the wire 51 has a structure in which an upper holder 10a and a lower holder 10b are sidable along each other and in which the holders 10a and 10b are kept to a predetermined length by means of an elastic spring, or more specifically, a preloaded compression spring 10c. However, when a load exceeding a reference value is applied to the seed crystal holder 10, the compression spring 10c compresses to slide the upper holder 10a along the lower holder 10b, which immediately expands the seed crystal holder 10. Further, since the outside diameter of a rim 10d provided on the upper holder 10a is larger than that of a pulling hole 11a provided at the center of the holding mechanism 11, the rim 10d of the seed crystal holder functions as means for pulling the holding mechanism 11.

The holding mechanism 11 is designed to be rotationally supported by a stand-by positioner 54 that is provided on the inner circumferential surface of the metal chamber 53. That is, a magnet 55 is provided on the upwardly facing inner circumferential surface of the stand-by positioner 54, and a ringlike magnet 55 is provided also on the downwardly facing outer circumferential surface of the holding mechanism so as to confront the magnet 55 on the positioner 54. As a result of such arrangement, the holding mechanism 11 is so structured as to magnetically float through the receiving levers 56. The engaging members 15 are provided on the lower end portion of the inner surface of the holder. It should be noted that, as shown in the reference drawing of FIG. 12, the receiving levers 56 are of a turning type, and thus the holding mechanism 11 (the holder 12 is shown as the holding mechanism in the reference drawing) can move up and down by the turning operation of these levers without being regulated by the stand-by positioner 54 and the ringlike magnets 55.

The structure of each engaging member provided on the holding mechanism in the third pulling apparatus can be described on the basis of FIG. 7 referred to above. The engaging members are provided on the lower end portion of the inner surface of the holder 12, and a plurality of clamp levers 15 are rotationally supported. As a result, the clamp levers 15 can turn substantially upright about the fulcrums provided on the side of the holder 12. However, once loaded downwardly, the clamp levers 15 can engage and grip the engaging stepped portion of a single crystal adequately with their self-clamping function. Particularly, the clamp mechanism shown in FIG. 7 is simple. In addition, since a single crystal is clamped with the end faces of the clamp levers, the length of the tapered portion of the engaging stepped portion of the single crystal can be made relatively short.

As another type of engaging member to be provided on the holding mechanism, an engaging member having the structure shown in FIG. 3 may be used. That is, the engaging member comprises a single clamp catch 13 and two upper and lower link levers 14 for the catch 13. The link levers 14 may be attached to the holder 12 in any way as long as the levers 14 are rotationally supported. Likewise, the clamp catch 13 may be attached to the link levers 14 in any way as long as the catch 13 is rotationally supported. It should be noted that if an elongated hole 35 having a larger inside diameter than a pin 34 is provided in at least one of the connecting portions of the two upper and lower link levers 14, the engaging surfaces of the clamp catches 13 can well match the engaging stepped portion. Hence, this arrangement is more desirable.

If the structures shown in FIGS. 3 and 7 referred to above are to be adopted as the engaging member, the number of engaging members to be provided on the inner circumferential surface of the holder 12 must be plural, and it is desirable, as described above, that three or more engaging members be provided in order to eliminate the problems of nonuniform shape of the engaging stepped portion of a single crystal and its displacement from the proper pulling position.

Next, a specific operating procedure will be described. At the time of a single crystal pulling start, the holding mechanism 11 is magnetically floated by the stand-by positioner 54 provided on the inner circumferential surface of the metal chamber 53, and stands by while rotationally supported. On the other hand, a seed crystal 9 is attached to the seed crystal holder 10 provided on the distal end of the wire 51 that is to be wound up by the pulling means 52, and the seed crystal 9 is brought into contact with the surface of the silicon melt 2 at a central part of the melt. The pulling means 52 is thereafter operated to slowly elevate the seed crystal 9 by rotating the crystal, thereby forming a dash neck portion 8. Then, the speed for pulling up the single crystal is decreased to increase the diameter of the single crystal, thereby forming the large-diameter portion 7. Thereafter, the diameter of the single crystal is gradually decreased so as to be as small as a constricted portion 5, thereby forming an engaging stepped portion 6 whose cross section is of an inverted cone.

After the engaging stepped portion 6 has been formed, the diameter of the single crystal is increased again, thereby forming a shoulder 4. Thereafter, the pulling and rotating speeds are adjusted to regular conditions, so that the operation proceeds to the next step of pulling up a single crystal body 3 having a predetermined diameter.

After the step of pulling the single crystal having a predetermined diameter has been started, the engaging stepped portion 6 of the single crystal is elevated as the pulling operation progresses, and comes in contact with the holding mechanism 11 that has been standing by in the upper position. At that time, the clamp levers 15 that are in contact with the large-diameter portion 7 of the single crystal are opened while pushed upward, thereby letting the large-diameter portion 7 pass therethrough as described above. After the large-diameter portion 7 of the engaging stepped portion has passed through, the clamp levers 15 of the holding mechanism 11 are closed by their own weight so as to get along with the shape of the engaging stepped portion of the single crystal.

As the single crystal pulling operation further progresses, the weight to be borne by the dash neck 8 is increased. However, it is so arranged that the compression spring incorporated in the seed crystal holder 10 starts deforming when the weight of the single crystal being pulled reaches the reference value before such weight reaches the limit of the strength of the dash neck 8. The compression spring 10c is compressed by the single crystal whose weight is equal to or greater than the reference value, which then causes the upper holder 10a to slide along the lower holder 10b, thereby causing the seed crystal holder 10 to expand. As a result, the weight of the single crystal is directly loaded onto the engaging members 15, and thus the engaging members of the holding mechanism engage and grip the engaging stepped portion of the single crystal reliably.

At that time, since the holding mechanism is rotationally supported by the metal chamber, the holding mechanism, after having engaged and gripped the engaging stepped portion of the single crystal, gets integrated with the pulling means through the engaging stepped portion, so that the holding mechanism rotates at the same speed as the pulling means. On the other hand, in the apparatus of this embodiment, the outside diameter of the rim 10d provided on the seed crystal holder 10 is larger than the inside diameter of the pulling hole 11a provided at the center of the holding mechanism. Therefore, the rim 10d provided on the upper holder 10a supports the holding mechanism 11 either when the seed crystal holder is further pulled and elevated by the pulling means or when the seed crystal holder expands as a result of the compression spring further deforming. Hence, after the holding mechanism engages and grips the engaging stepped portion of the single crystal and is then supported by the upper holder, the holding mechanism is pulled upward while rotating in synchronism with the pulling means.

INDUSTRIAL APPLICABILITY

An apparatus for pulling a single crystal of this invention comprise pulling means for forming an engaging stepped portion on a single crystal and a holding mechanism for gripping the engaging stepped portion of the single crystal. The apparatus causes the holding mechanism to start its operation of holding the single crystal before the weight of the single crystal reaches the limit of a load that can be borne by the dash neck portion as the weight of the single crystal increases in association with the progress of the pulling operation. Thus, even when pulling up a heavy single crystal, the apparatus can engage and grip such heavy single crystal reliably, thereby implementing safe fabrication of a single crystal free from falling accidents.

Therefore, the apparatus for pulling a single crystal of the invention are suitable as a pulling technology that meets the needs for increased efficiency in the manufacture of semiconductors, and hence can be utilized in the field of producing silicon single crystals for semiconductors.

What is claimed is:

1. An apparatus for pulling a single crystal having main pulling means of a wire type for forming an inverted-conical engaging stepped portion on the single crystal to be pulled while rotated, a holding mechanism for gripping the engaging stepped portion of the single crystal through engaging members, sub pulling means of a wire type for moving the holding mechanism up and down, and means for preventing inclination of the holding mechanism when a difference occurs between winding and delivery of the wire of the sub pulling means, the sub pulling means moving the holding mechanism up and down through means for preventing inclination of the holding mechanism and elevating the holding mechanism in synchronism with the pulling speed of the main pulling means.

2. An apparatus for pulling a single crystal according to claim 1, characterized in that a drive motor of either one of the main pulling means and the sub pulling means is operated under a speed control system and that the other drive motor is operated under a tension control system.

3. An apparatus for pulling a single crystal according to claim 1, characterized in that the holding mechanism comprises the engaging members that match a shape of the engaging stepped portion of the single crystal and that perform a self-clamping function by operation of link levers or clamp levers.

4. An apparatus for pulling a single crystal according to claim 3, characterized in that many saw-toothed or undulating projections are formed on engaging surfaces of the engaging members.

5. An apparatus for pulling a single crystal having main pulling means for forming an inverted-conical engaging stepped portion on the single crystal to be pulled while rotated, a holding mechanism for gripping the engaging stepped portion of the single crystal through engaging members, and sub pulling means for moving the holding mechanism up and down in synchronism with a pulling speed of the main pulling means, characterized in that:

the main pulling means and the sub pulling means can move up and down independently of each other by turning operation of ball screws, respectively, and the holding mechanism comprises the engaging members that match a shape of the engaging stepped portion of the single crystal and that perform a self-clamping function by operation of link levers or clamp levers.

6. An apparatus for pulling a single crystal according to claim 5, characterized in that many saw-toothed or undulating projections are formed on engaging surfaces of the engaging members.

7. An apparatus for pulling a single crystal having main pulling means for forming an inverted-conical engaging stepped portion on the single crystal to be pulled while rotated, a holding mechanism for gripping the single crystal, and sub pulling means for moving the holding mechanism up and down in synchronism with a pulling speed of the main pulling means, characterized in that:

the holding mechanism comprises push rods for reciprocating up and down to which the holding mechanism moves up and down, and engaging members for engaging and gripping the engaging stepped portion of the single crystal while turned by upward moving operation of the push rods.

8. An apparatus for pulling a single crystal according to claim 7, characterized in that the main pulling means and the sub pulling means can move up and down independently of each other by winding and unwinding wires, respectively, and that the sub pulling means moves the holding mechanism up and down through means for preventing inclination of the holding mechanism.

9. An apparatus for pulling a single crystal according to claim 7, characterized in that the main pulling means and the sub pulling means can move up and down independently of each other by turning operation of ball screws, respectively.

10. An apparatus for pulling a single crystal having pulling means for forming an inverted-conical engaging stepped portion by pulling while rotating the single crystal that is supported by a seed crystal holder, a holding mechanism for gripping the engaging stepped portion of the single crystal through engaging members, and a metal chamber for accommodating the pulling means and the holding mechanism, characterized in that:

the seed crystal holder has such a structure as to expand as the single crystal grows; and the holding mechanism has such a structure as to be pulled while rotated in synchronism with the seed crystal holder after having gripped the engaging stepped portion of the single crystal with the engaging members.

11. An apparatus for pulling a single crystal according to claim 10, characterized in that the seed crystal holder has a structure in which an upper holder can slide along a lower holder and in which an elastic spring is incorporated.

12. An apparatus for pulling a single crystal according to claim 10, characterized in that the holding mechanism is so structured as to float magnetically by providing a magnet on a downwardly facing outer circumferential surface of the holding mechanism and by providing a magnet also on an upwardly facing inner circumferential surface of the metal chamber confronting the magnet on the downwardly facing outer circumferential surface.

13. An apparatus for pulling a single crystal according to claim 10, characterized in that the holding mechanism has the engaging members that match a shape of the engaging stepped portion of the single crystal and that perform a self-clamping function by operation of link levers or clamp levers.

* * * * *